United States Patent
Takabayashi et al.

(10) Patent No.: US 7,263,135 B2
(45) Date of Patent: Aug. 28, 2007

(54) TRANSMITTING METHOD AND TRANSMITTER APPARATUS

(75) Inventors: Shinichiro Takabayashi, Yokosuka (JP); Masato Ukena, Yokosuka (JP); Masayuki Orihashi, Ichikawa (JP); Michiaki Matsuo, Machida (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 417 days.

(21) Appl. No.: 10/505,084

(22) PCT Filed: Oct. 2, 2003

(86) PCT No.: PCT/JP03/12642

§ 371 (c)(1),
(2), (4) Date: Aug. 19, 2004

(87) PCT Pub. No.: WO2004/032345

PCT Pub. Date: Apr. 15, 2004

(65) Prior Publication Data

US 2005/0079835 A1   Apr. 14, 2005

(30) Foreign Application Priority Data

Oct. 3, 2002 (JP) ............................. 2002-290911
May 28, 2003 (JP) ............................. 2003-150669

(51) Int. Cl.
 *H04K 1/02* (2006.01)
 *H04B 1/04* (2006.01)
 *H03C 1/62* (2006.01)

(52) U.S. Cl. .................. 375/296; 375/297; 455/127.1; 455/114.2; 455/115.1

(58) Field of Classification Search .............. 375/296, 375/297; 455/127.1, 114.2, 115.1
See application file for complete search history.

(56) References Cited

U.S. PATENT DOCUMENTS 3,829,782 A * 8/1974 Dillman et al. ............. 455/102

(Continued)

FOREIGN PATENT DOCUMENTS

JP    2002-135062 A    5/2002

(Continued)

OTHER PUBLICATIONS

International Search Report for application No. PCT/JP03/12642 dated Jan. 20, 2004.

(Continued)

*Primary Examiner*—Mohammed Ghayour
*Assistant Examiner*—Nurul M Matin
(74) *Attorney, Agent, or Firm*—RatnerPrestia (57) ABSTRACT

A transmitting method and a transmitter apparatus, which need no manual adjustment, are disclosed. A delay amount is automatically adjusted such that an out-of-band distortion component of a transmission signal is minimized, and a correct timing is produced by the method and the apparatus. In this transmitter apparatus, a first delay adjusts a control timing over a voltage that controls a power amplifier, and a distributor distributes an output from the power amplifier in order to feedback parts of the output. A distortion adjusting units calculating a distortion component of the transmission signal by using the signal fed back by the distributor, and adjusts automatically a delay amount of the first delay so as to minimize the distortion component. This structure allows eliminating manual adjustment, and obtaining high power-efficiency with fewer distortions.

14 Claims, 8 Drawing Sheets

U.S. PATENT DOCUMENTS

| | | | |
|---|---|---|---|
| 4,709,269 A * | 11/1987 | Ozaki | 348/622 |
| 6,567,478 B2 * | 5/2003 | Oishi et al. | 375/297 |
| 6,703,897 B2 * | 3/2004 | O'Flaherty et al. | 330/149 |
| 2003/0068990 A1 * | 4/2003 | Sorrells et al. | 455/118 |
| 2003/0107434 A1 * | 6/2003 | Mitzlaff | 330/149 |

FOREIGN PATENT DOCUMENTS

| | | |
|---|---|---|
| WO | WO 01/22572 A1 | 3/2001 |
| WO | WO 01/63795 A1 | 8/2001 |
| WO | WO 01/86806 A2 | 11/2001 |

OTHER PUBLICATIONS

Kahn, Leonard R., Single-Sideband Tranmission by Envelope Elimination and Restoration, Proceedings of the I.R.E., Jul. 1952, pp. 803-806.

Raab, et al., Frederick H., Power Amplifiers and Transmitters for RF and Microwave, IEEE Transactions On Microwave Theory And Techniques, vol. 50, No. 3, Mar. 2002, pp. 814-826.

* cited by examiner

TRANSMITTING METHOD AND TRANSMITTER APPARATUS

THIS APPLICATION IS A U.S. NATIONAL PHASE APPLICATION OF PCT INTERNATIONAL APPLICATION PCT/JP2003/012642.

TECHNICAL FIELD

The present invention relates to a transmitting method and a transmitter apparatus that improve the linearity and the power efficiency of a power amplifier in a radio communication system.

BACKGROUND ART

A power amplifier of a transmitter apparatus in a radio communication system is a circuit that consumes the largest amount of power in the entire apparatus, thus the power amplifier has been required to improve its power efficiency. Radio communication systems in recent years transmit a large amount of data, so that linear modulation signals at a high speed and in a broadband are used. Thus a non-linear amplifier of high power-efficiency, such as class C or class D amplifier, is not used. Instead, a liner amplifier of lower power-efficiency, such as class A or class AB amplifier is used with an appropriate margin in back-off (difference between the max. output amplitude level and the saturated output power level).

A smaller back-off for improving the power efficiency sometime increases distortions and widens spectrum of the transmitter apparatus, thereby interfering in an adjacent communication channel.

One of the methods to solve the problem of improving the power efficiency and yet retaining the linearity of a power amplifier is a method of envelope elimination and restoration (EER). This method is disclosed in "Single-sideband transmission by envelope elimination and restoration" written by Kahn, in Proc. IRE, July 1952, page 803-806. According to this method, a transmitter apparatus decomposes a transmission signal into an amplitude component and a phase component, and the phase component, which is to be an envelope signal, is amplified by a non-linear amplifier of high power-efficiency. The power supply of the amplifier is controlled by the amplitude component. The amplitude component and the phase component are thus restructured.

Figure 7:
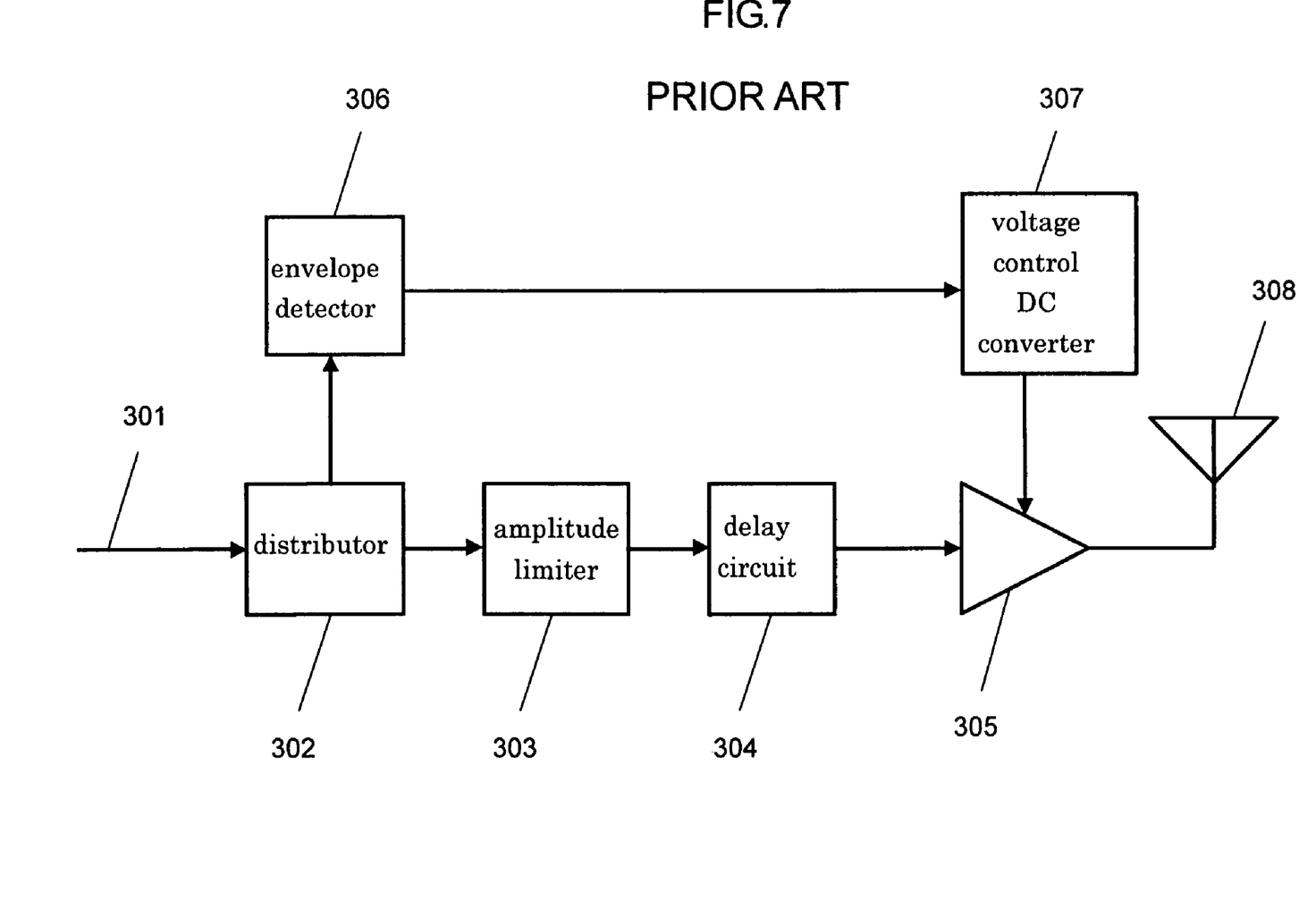
FIG. 7 shows a block diagram illustrating a conventional transmitter apparatus.

FIG. 7 shows a structure of a transmitter apparatus adopting the method of envelope elimination and restoration. Distributor 302 receives transmission RF signal 301 and distributes it to amplitude limiter 303 and envelope detector 306. Limiter 303 limits the amplitude of the signal distributed by distributor 302 to a bandwidth, thereby obtaining a phase component of transmission RF signal 301. Delay circuit 304 appropriately delays an output of limiter 303.

Power amplifier 305 amplifies an output from delay circuit 304 up to a desirable power level. Envelope detector 306 envelope-detects a signal supplied from distributor 302, thereby obtaining an amplitude component of transmission RF signal 301. Voltage control DC converter 307 outputs a voltage based on a signal supplied from envelope detector 306. Converter 307 controls power amplifier 305 with this voltage.

For instance, when a field effect transistor (FET) is used as power amplifier 305, the voltage supplied from converter 307 controls the drain voltage of power amplifier 305, so that converter 307 modulates the amplitude. The operation discussed above restructures the amplitude component and the phase component of the output from power amplifier 305 into a signal, which is then transmitted from antenna 308.

A method of envelope tracking is known as another method to solve the problem of improving the power efficiency and retaining the linearity, this method is disclosed in "Power amplifiers and transmitters for RF and microwave" written by Raab, F. H.; Asbeck, P; Cripps, S; Kenigton, P. B.; Popovic, Z. B.; Pothecary, N.; Sevic, J. F.; Sokal, N. O.; microwave Theory and Techniques, IEEE Transactions on, Volume: 50 Issue: 3 Mar. 2002, pages: 814-826.

According to this method, an envelope detector detects an amplitude component of a transmission RF signal, and a voltage to be supplied to the power amplifier is controlled in response to the amplitude component detected. The original transmission RF signal, which includes not only a phase component but also an amplitude component, is supplied to the power amplifier, which thus needs to be a linear amplifier.

Figure 8A:
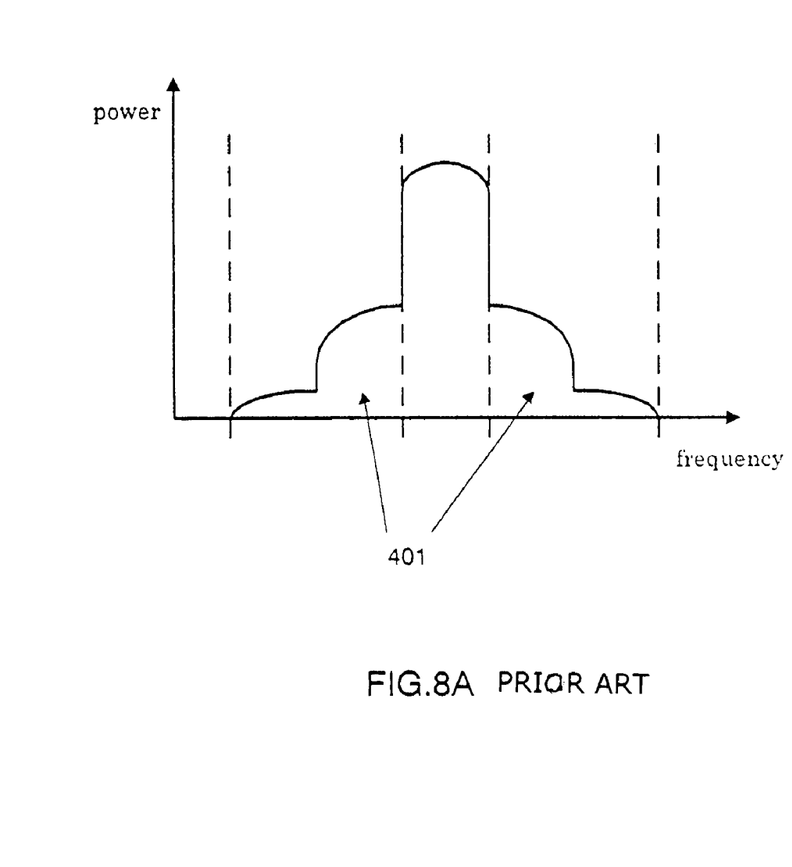
FIG. 8 shows characteristics of spectrum of a transmission signal when timing errors happen or when no errors happen at the timing of controlling a voltage of a power amplifier.
Figure 8B:
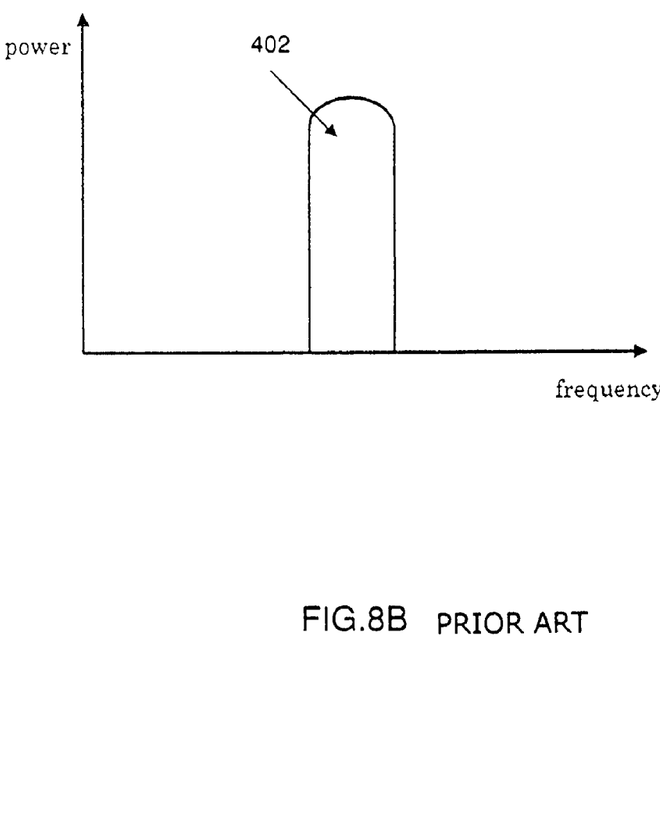

In the conventional structures discussed above, the voltage control timing needs to be provided exactly to a transmission signal by a delay circuit. FIG. 8A shows a spectrum of a transmission signal having a timing error in voltage control, and FIG. 8B shows a spectrum where no timing error in voltage control is observed.

A timing error produces distortion components 401 as shown in FIG. 8A, and the distortions degrade the performance of the transmission signal as well as interfere in the adjacent channel. No timing errors produce transmission signal 402 free from distortions as shown in FIG. 8B. However, the timing adjustment discussed above is manually done and is a time-consuming job. The timing once adjusted sometimes cannot follow the changes caused by temperature changes or aged deterioration in characteristics of the apparatus.

DISCLOSURE OF THE INVENTION

The present invention aims to provide a transmitting method and a transmitter apparatus which can save manual adjustment, adjust automatically a delay amount of a delaying means so that a distortion component out-of-band of a transmission signal can be minimized, and produce a correct timing.

The transmitting method of the present invention controls a voltage of a power amplifying means in response to an envelope amplitude of a transmission signal. To be more specific, the method detects a distortion component of an output signal supplied from the power amplifying means, and automatically controls a timing of controlling the voltage that controls the power amplifying means.

The foregoing method eliminates manual adjustment, and adjusts automatically a delay amount of a delaying means so that a distortion component out-of-band of a transmission signal can be minimized, and produces a correct timing.

The transmitter apparatus of the present invention comprises the following elements:

a first delaying means for adjusting a timing of controlling the voltage that controls the power amplifying means;

a distributor for distributing an output from the power amplifying means to feedback the output; and a distortion adjusting means for calculating a distortion component of a transmission signal by using a signal fed back by the distributor, and adjusting automatically a delay amount of the first delaying means so that the distortion component can be minimized.

The foregoing structure eliminates the manual adjustment, and adjusts automatically a delay amount of a delaying means so that a distortion component out-of-band of the transmission signal can be minimized, and produces a correct timing.

BEST MODE FOR PRACTICING THE INVENTION

Exemplary embodiments of the present invention are demonstrated hereinafter with reference to the accompanying drawings.

Exemplary Embodiment 1

Figure 1:
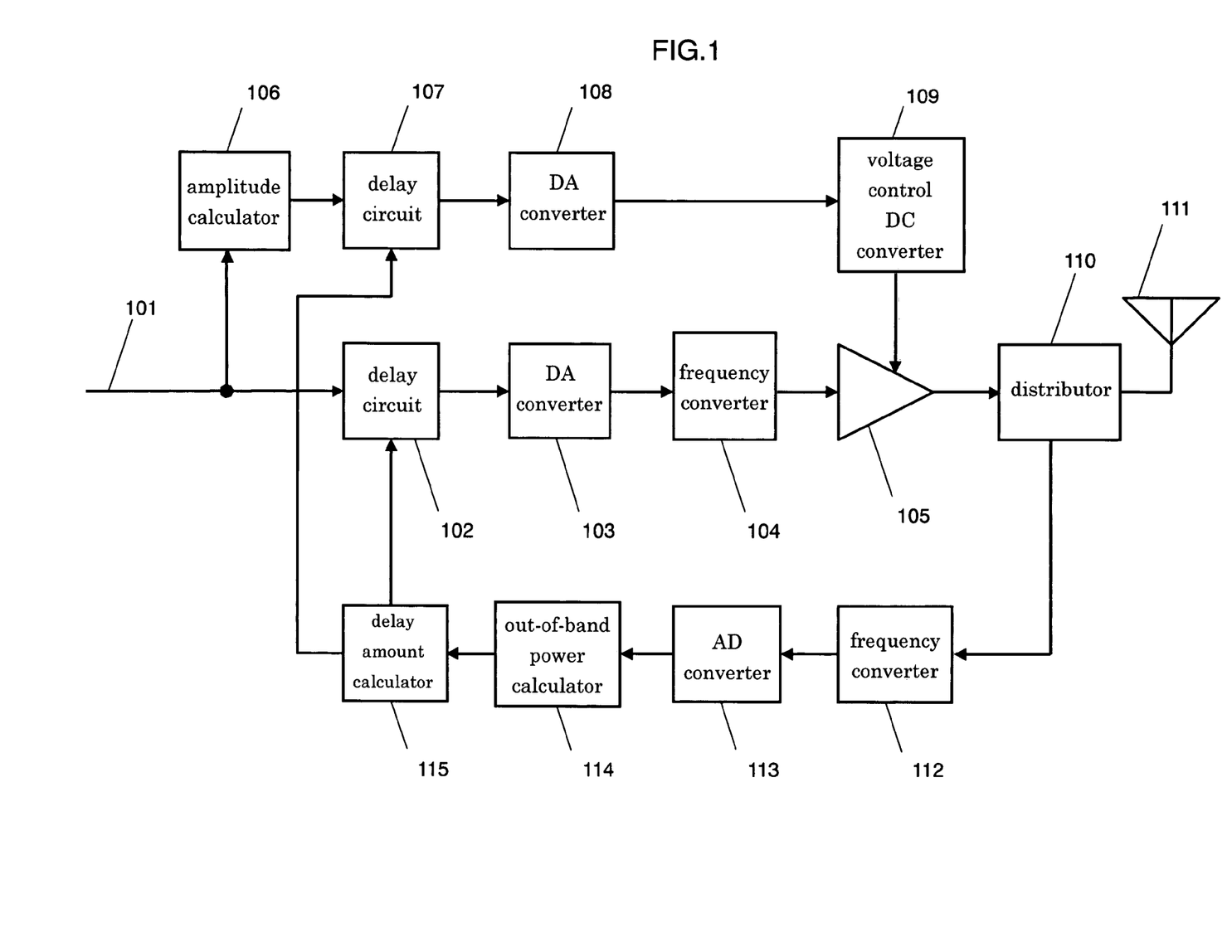
FIG. 1 shows a block diagram illustrating a transmitter apparatus in accordance with a first exemplary embodiment of the present invention.

FIG. 1 shows a block diagram illustrating a transmitter apparatus in accordance with the first exemplary embodiment of the present invention. Delay circuit 102 delays its input signal before outputting it. DA converter 103 converts its input signal into an analog signal. Frequency converter 104 up-converts its input signal into an RF signal. Power amplifier 105 amplifies its input signal. Amplitude calculator 106 calculates an amplitude component of its input signal before outputting it.

Delay circuit 107 delays its input signal. DA converter 108 converts its input signal into an analog signal. Voltage control DC converter 109 outputs a voltage that controls power amplifier 105 based on an output from DA converter 108. Distributor 110 distributes an output from power amplifier 105 to antenna 111 and frequency converter 112.

Antenna 111 transmits the signal distributed by distributor 110. Frequency converter 112 converts a frequency of the signal distributed by distributor 110. AD converter 113 converts its input signal into a digital signal. Out-of-band power calculator 114 calculates out-of-band power of its input signal. Delay amount calculator 115 calculates an amount of delay and outputs it so that the out-of-band power calculated by calculator 114 can be minimized.

An operation of the foregoing transmitter apparatus is demonstrated hereinafter. Delay circuit 102 delays transmission base-band signal 101 by an amount designated by delay amount calculator 115. DA converter 103 converts the signal supplied from delay circuit 102 into an analog signal. Frequency converter 104 up-converts the signal supplied from converter 103 into a desirable RF signal. Power amplifier 105 amplifies the signal supplied from frequency converter 104 up to a desirable power level.

The input signal to power amplifier 105 is a linear modulation signal accompanying changes in envelope-amplitude, so that a linear amplifier of class A or class AB is employed.

On the other hand, amplitude calculator 106 calculates an amplitude component of the transmission base-band signal, then outputs it. Delay circuit 107 delays the amplitude component supplied from calculator 106 by an amount designated by delay calculator 115. DA converter 108 converts the signal supplied from delay circuit 107 into an analog signal. Based on the output from DA converter 108, voltage control DC converter 109 outputs a voltage that controls power amplifier 105. For instance, when an FET is used as power amplifier 105, its drain voltage or gate voltage is controlled with a voltage supplied from voltage control DC converter 109.

Distributor 110 distributes the output from power amplifier 105 to antenna 111 and frequency converter 112. Antenna 111 transmits the signal distributed from distributor 110. Frequency converter 112 down-converts the signal distributed from distributor 110 into a base-band signal or an IF signal. AD converter 113 converts the signal supplied from frequency converter 112 into a digital signal.

Out-of-band power calculator 114 calculates out-of-band power of the signal supplied from AD converter 113. The out-of-band power is, e.g. an amount of leakage power to an adjacent channel or a leakage power ratio to the adjacent channel. If the leakage power ratio exceeds a given value due to malfunction of power amplifier 105, the operation of the apparatus is stopped, so that transmission of an abnormal signal from antenna 111 is prevented.

Delay amount calculator 115 calculates a delay amount such that the out-of-band power obtained by calculator 114 can be minimized, and outputs the resultant amount to delay circuits 102 and 107.

As discussed above, in the transmitter apparatus, delay amount calculator 115 sets a delay amount in delay circuits 102 and 107 such that the out-of-band power obtained by out-of-band power calculator 114 can be minimized. A control timing over power amplifier 105 is automatically adjusted by voltage control DC converter 109. Thus the transmitter apparatus can obtain high power-efficiency with fewer distortions.

Delay circuits 102 and 107 can be formed of buffer memories in a necessary and changeable unit of delay or tapped delay lines. An amount of buffer of the memories or a tap coefficient is changed in the case of changing a delay amount.

Exemplary Embodiment 2

Figure 2:
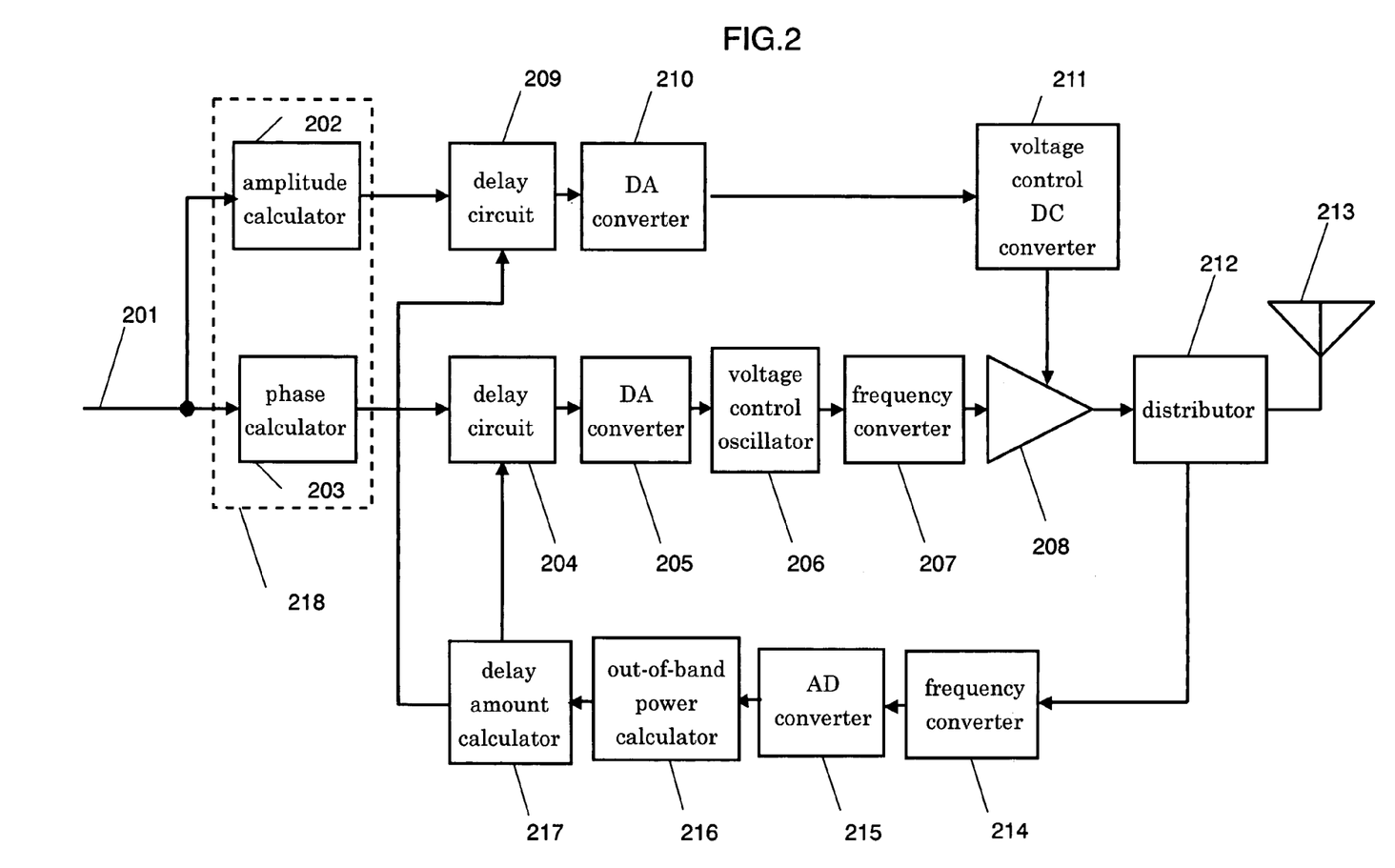
FIG. 2 shows a block diagram illustrating a transmitter apparatus in accordance with a second exemplary embodiment of the present invention.

FIG. 2 shows a block diagram illustrating a transmitter apparatus in accordance with the second exemplary embodiment of the present invention. Computation circuit 218 is formed of amplitude calculator 202 and phase calculator 203. Amplitude calculator 202 calculates an amplitude component of transmission base-band signal 201 supplied thereto. Phase calculator 203 calculates a phase component of signal 201 supplied thereto. Delay circuit 204 delays an output signal supplied from phase calculator 203.

DA converter 205 converts the output from delay circuit 204 into an analog signal. Voltage control oscillator 206 carries out phase modulation based on the output from DA converter 205. Frequency converter 207 converts a frequency of the output from oscillator 206. Power amplifier 208 amplifies the output from frequency converter 207 up to a desirable level. Delay circuit 209 delays the output supplied from amplitude calculator 202.

DA converter 210 converts the output signal from delay circuit 209 into an analog signal. Based on the output signal from converter 210, voltage control DC converter 211 outputs a voltage that controls amplifier 208. Distributor 212 distributes the signal supplied from amplifier 208 to antenna 213 and frequency converter 214. Antenna 213 transmits the signal distributed by distributor 212.

Frequency converter 214 converts a frequency of the signal distributed by distributor 212. AD converter 215 converts a signal supplied from frequency converter 214 into a digital signal. Out-of-band power calculator 216 calculates out-of-band power of a signal supplied thereto. Delay amount calculator 217 calculates a delay amount such that the out-of-band power obtained by calculator 216 is minimized, and outputs the resultant amount.

An operation of the foregoing transmitter apparatus is demonstrated hereinafter. Computation circuit 218 receives transmission base-band signal 201, and calculates an amplitude component at amplitude calculator 202 as well as calculates a phase component at phase calculator 203. Delay circuit 204 delays the phase component supplied from phase calculator 203 by an amount designated by delay amount calculator 217. DA converter 205 converts the signal supplied from delay circuit 204 into an analog signal.

Voltage control oscillator 206 carries out phase modulation based on the signal supplied from DA converter 205. Frequency converter 207 up-converts the output from oscillator 206 into an RF signal. Power amplifier 208 amplifies the output from frequency converter 207 up to a desirable level. The signal fed into amplifier 208 is an envelope signal, so that amplifier 208 can employ a class C or class D non-linear amplifier excellent in power efficiency.

On the other hand, delay circuit 209 delays an amplitude component supplied from amplitude calculator 202 by a delay amount designated by delay amount calculator 217. DA converter 210 converts the signal supplied from delay circuit 209 into an analog signal. Based on the signal output from DA converter 210, voltage control DC converter 211 outputs a voltage that controls power amplifier 208.

For instance, when an FET is used as amplifier 208, the drain voltage of amplifier 208 is controlled with the voltage supplied from converter 211, thereby carrying out amplitude modulation. Distributor 212 distributes an output from amplifier 208 undergone the amplitude modulation under the control of converter 211 to antenna 213 and frequency converter 214. Antenna 213 transmits the signal distributed by distributor 212.

Frequency converter 214 down-converts the signal distributed by distributor 212 into a base-band signal or an IF signal. AD converter 215 converts the signal supplied from frequency converter 214 to a digital signal. Out-of-band power calculator 216 calculates out-of-band power of a transmission signal included in the output from AD converter 215. The out-of-band power is, e.g. an amount of leakage power to an adjacent channel or a leakage power ratio to the adjacent channel.

If the leakage power ratio exceeds a given value due to malfunction of power amplifier 208, the operation of the apparatus is stopped, so that transmission of an abnormal signal from antenna 213 is prevented. Based on an output from out-of-band power calculator, delay amount calculator 217 calculates a delay amount such that the out-of-band power obtained by calculator 216 becomes minimized, and outputs the resultant amount to delay circuits 204 and 209.

As discussed above, in the transmitter apparatus, delay amount calculator 217 sets a delay amount in delay circuits 204 and 209 such that the out-of-band power obtained by out-of-band power calculator 216 is minimized. A control-timing over power amplifier 208 is automatically adjusted by voltage control DC converter 211. Thus the apparatus can obtain high power-efficiency with fewer distortions.

Exemplary Embodiment 3

Figure 3:
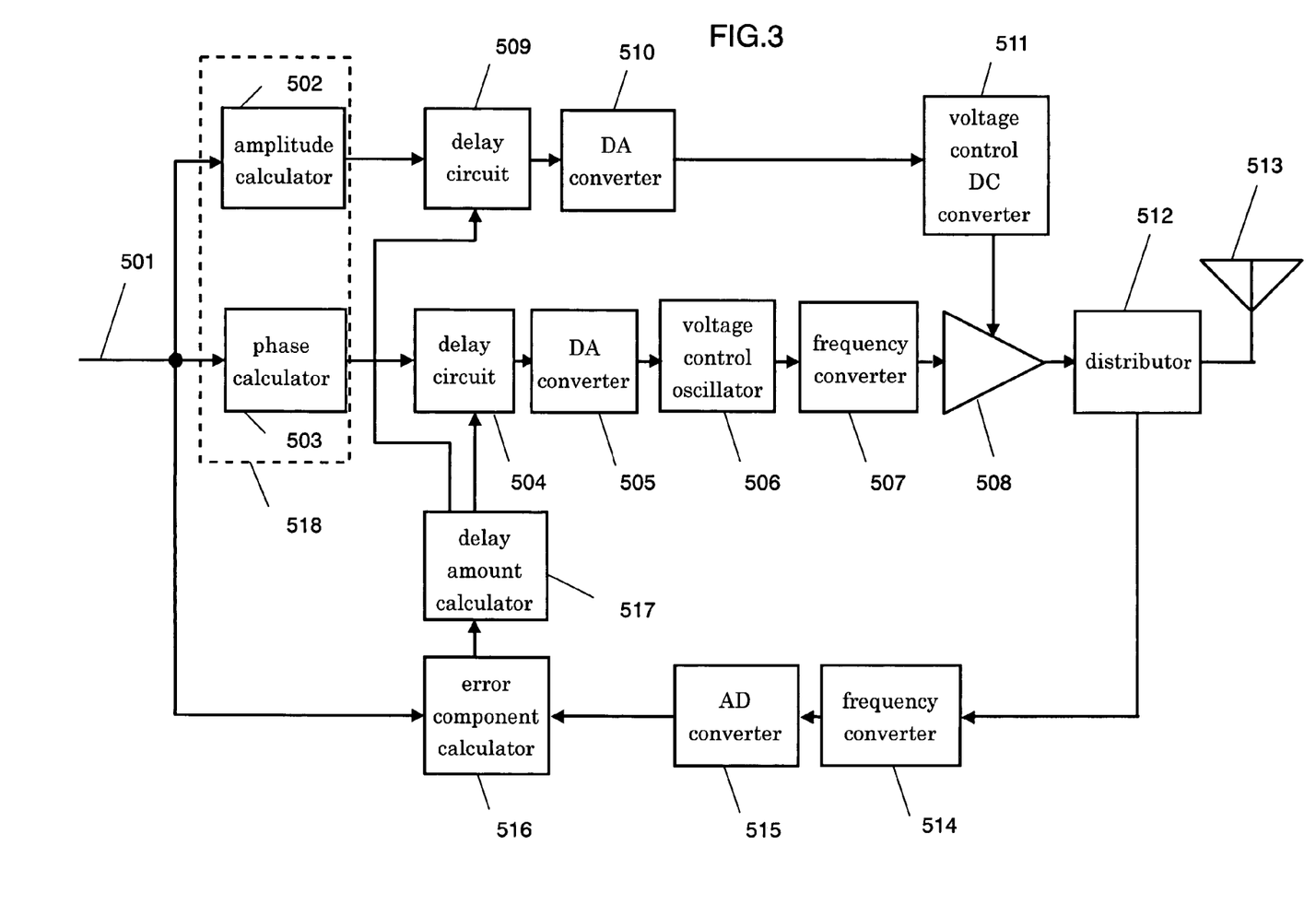
FIG. 3 shows a block diagram illustrating a transmitter apparatus in accordance with a third exemplary embodiment of the present invention.

FIG. 3 shows a block diagram illustrating a transmitter apparatus in accordance with the third exemplary embodiment of the present invention. Computation circuit 518 is formed of amplitude calculator 502 and phase calculator 503. Amplitude calculator 502 calculates an amplitude component of transmission base-band signal 501 supplied thereto. Phase calculator 503 calculates a phase component of signal 501 supplied thereto. Delay circuit 504 delays an output signal supplied from phase calculator 503.

DA converter 505 converts the output from delay circuit 504 into an analog signal. Voltage control oscillator 506 carries out phase modulation based on the output from DA converter 505. Frequency converter 507 converts a frequency of the output from oscillator 506. Power amplifier 508 amplifies the output from frequency converter 507 up to a desirable level. Delay circuit 509 delays the output supplied from amplitude calculator 502.

DA converter 510 converts the output signal from delay circuit 509 into an analog signal. Based on the output signal from converter 510, voltage control DC converter 511 outputs a voltage that controls amplifier 508. Distributor 512 distributes the signal supplied from amplifier 508 to antenna 513 and frequency converter 514. Antenna 513 transmits the signal distributed by distributor 512.

Frequency converter 514 converts a frequency of the signal distributed by distributor 512. AD converter 515 converts a signal supplied from frequency converter 514 into a digital signal. Error component calculator 516 calculates an error component between an output signal from AD converter 515 and transmission base-band signal 501. Delay amount calculator 517 calculates a delay amount such that the error component obtained by calculator 516 becomes minimized, and outputs the resultant amount.

The transmitter apparatus in accordance with the third embodiment has a structure where delay amount calculator 517 calculates a delay amount based on the calculation done by error component calculator 516. Thus the same operations as those in the second embodiment are omitted here, and the different operations are focused hereinafter.

The processes starting from the calculation of the amplitude component and the phase component of transmission base-band signal 501 by computation circuit 518 to the transmission of the signal from antenna 513 via distributor 512 by power amplifier 508 are the same as those of the second embodiment.

Frequency converter 514 down-converts the signal distributed by distributor 512 into a base-band signal. AD converter 515 converts the signal supplied from frequency converter 514 to a digital signal. Error component calculator 516 receives the output signal from AD converter 515 and transmission base-band signal 501, and calculates an error component between those two signals at every sampling time predetermined.

Based on the error component supplied from calculator 516, delay amount calculator 517 calculates a delay amount such that the error component becomes minimized, and outputs the resultant amount to delay circuit 502 and 509.

As discussed above, in the transmitter apparatus, delay amount calculator 517 sets a delay amount in delay circuits 504 and 509 such that the error component obtained by error component calculator is minimized. A control timing over power amplifier 508 is automatically adjusted by voltage control DC converter 511. Thus the transmitter apparatus can obtain high power-efficiency with fewer distortions.

Exemplary Embodiment 4

Figure 4:
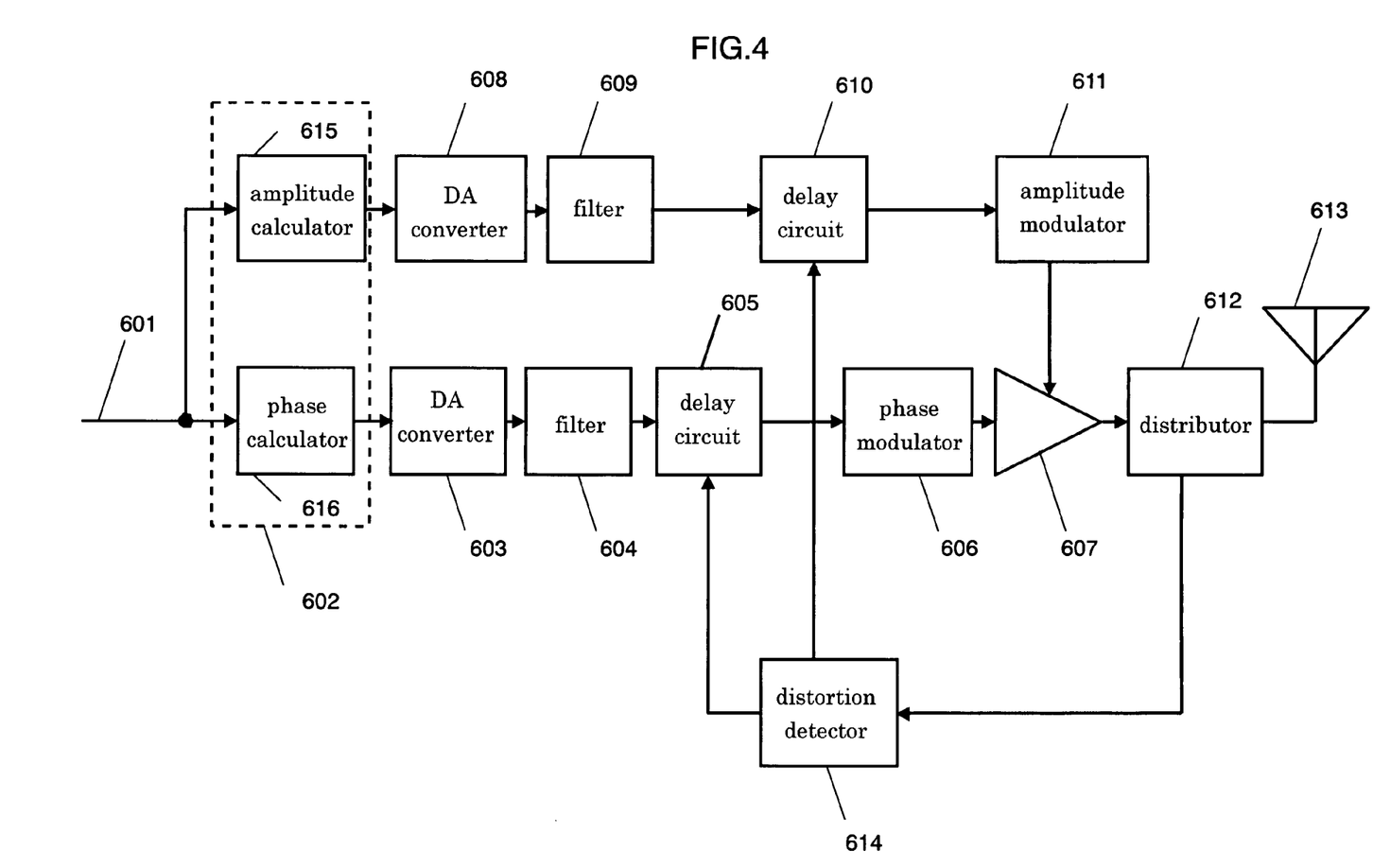
FIG. 4 shows a block diagram illustrating a transmitter apparatus in accordance with a fourth exemplary embodiment of the present invention.

FIG. 4 shows a block diagram illustrating a transmitter apparatus in accordance with the fourth exemplary embodiment of the present invention. Computation circuit 602 is formed of amplitude calculator 615 and phase calculator 616. Amplitude calculator 615 calculates an amplitude component of transmission base-band signal 601 supplied thereto. Phase calculator 616 calculates a phase component of signal 601 supplied thereto. DA converter 603 converts the output from phase calculator 616 into an analog signal.

Filter 604 passes specific frequencies out of a signal output from DA converter 603. Delay circuit 605 delays a signal output from filter 604. Phase modulator 606 carries out phase modulation based on a signal output from delay circuit 605. Power amplifier 607 amplifies an output from phase modulator 606 up to a desirable power level. DA converter 608 converts a signal output from amplitude calculator 615 into an analog signal.

Filter 609 passes specific frequencies out of a signal output from DA converter 608. Delay circuit 610 delays a signal output from filter 609. Based on a signal output from delay circuit 610, amplitude modulator 611 outputs a voltage that controls power amplifier 607. Distributor 612 distributes a signal supplied from power amplifier 607 to antenna 613 and distortion detector 614.

Antenna 613 transmits the signal distributed by distributor 612. Distortion detector 614 detects a distortion of the signal distributed by distributor 612, and sets a delay amount of delay circuits 605 and 610.

An operation of the foregoing transmitter apparatus is demonstrated hereinafter. Computation circuit 602 receives transmission base-band signal 601, and calculates an amplitude component at amplitude calculator 615 as well as calculates a phase component at phase calculator 616. DA converter 603 converts the phase component supplied from calculator 616 into an analog signal. Filter 604 passes specific frequencies out of the output from DA converter 603 and eliminates unnecessary frequencies.

Delay circuit 605 delays a signal supplied from filter 604 by an amount set by distortion detector 614. Phase modulator 606 carries out phase modulation based on a signal output from delay circuit 605. Power amplifier 607 amplifies an output from phase modulator 606 up to a desirable power level.

On the other hand, DA converter 608 converts the amplitude component output from amplitude calculator 615 to an analog signal. Filter 609 passes a specific frequency out of an output from DA converter 608, and eliminates unnecessary frequencies. Delay circuit 610 delays a signal output from filter 609 by an amount set by distortion detector 614.

Based on a signal output from delay circuit 610, amplitude modulator 611 outputs a voltage that controls power amplifier 607. This control voltage is applied to power amplifier 607 to output an amplitude component.

Phase modulator 606 is, e.g. the voltage control oscillator or the frequency converter used in the previous embodiments 1-3. Amplitude-modulator 611 is, e.g. the voltage control DC converter used in the previous embodiments 1-3.

Distributor 612 distributes an output from power amplifier 607 to antenna 613 and distortion detector 614. Antenna 613 transmits the signal distributed by distributor 612.

Distortion detector 614 detects an amount of distortion of the signal distributed by distributor 612. This detection is carried out by the following method: A transmission signal demodulated is digitally processed by, e.g. Fourier transform, then a level of distortion frequency component is calculated, or a transmission signal is frequency-converted into an analog base-band signal, then a distortion component is filtered out for level detection. Delay circuits 605 and 610 changes a delay amount with a control signal output from distortion detector 614.

Distortion detector 614 sets a delay amount such that a distortion to be detected is minimized. This delay amount is set by the following method: (1) Change a delay amount in an appropriate range for collecting data about the relation between delay amounts and distortion amounts, then select a delay amount, which gives the minimum distortion, from the data collected. Or (2) change a delay amount sequentially along measuring a distortion, thereby searching for a point that minimizes the distortion amount.

This transmitter apparatus, which includes a delay circuit in both the routes of the amplitude component and the phase component, is demonstrated hereinbefore; however, when which route has a greater delay amount is known in advance, the delay circuit can be disposed in either one of the routes.

The transmitter apparatus, which includes delay circuits 605 and 610 coupled to a stage after filters 604 and 609, is demonstrated hereinbefore; however, the function of delay circuits 605 and 610 can be embodied in filters 604 and 609.

Filters 604 and 609 work as low pass filters that smoothen the outputs from DA converters 603 and 608. A change in a value of the elements forming a circuit of the low pass filter thus allows changing a delay amount of a signal within a pass-band.

As discussed above, the transmitter apparatus can reduce the distortions produced in the power amplifier, and yet, obtain high power-efficiency by controlling a delay amount of an amplitude component or a phase component of a transmission signal such that a distortion amount of a transmission output is minimized.

Exemplary Embodiment 5

Figure 5:
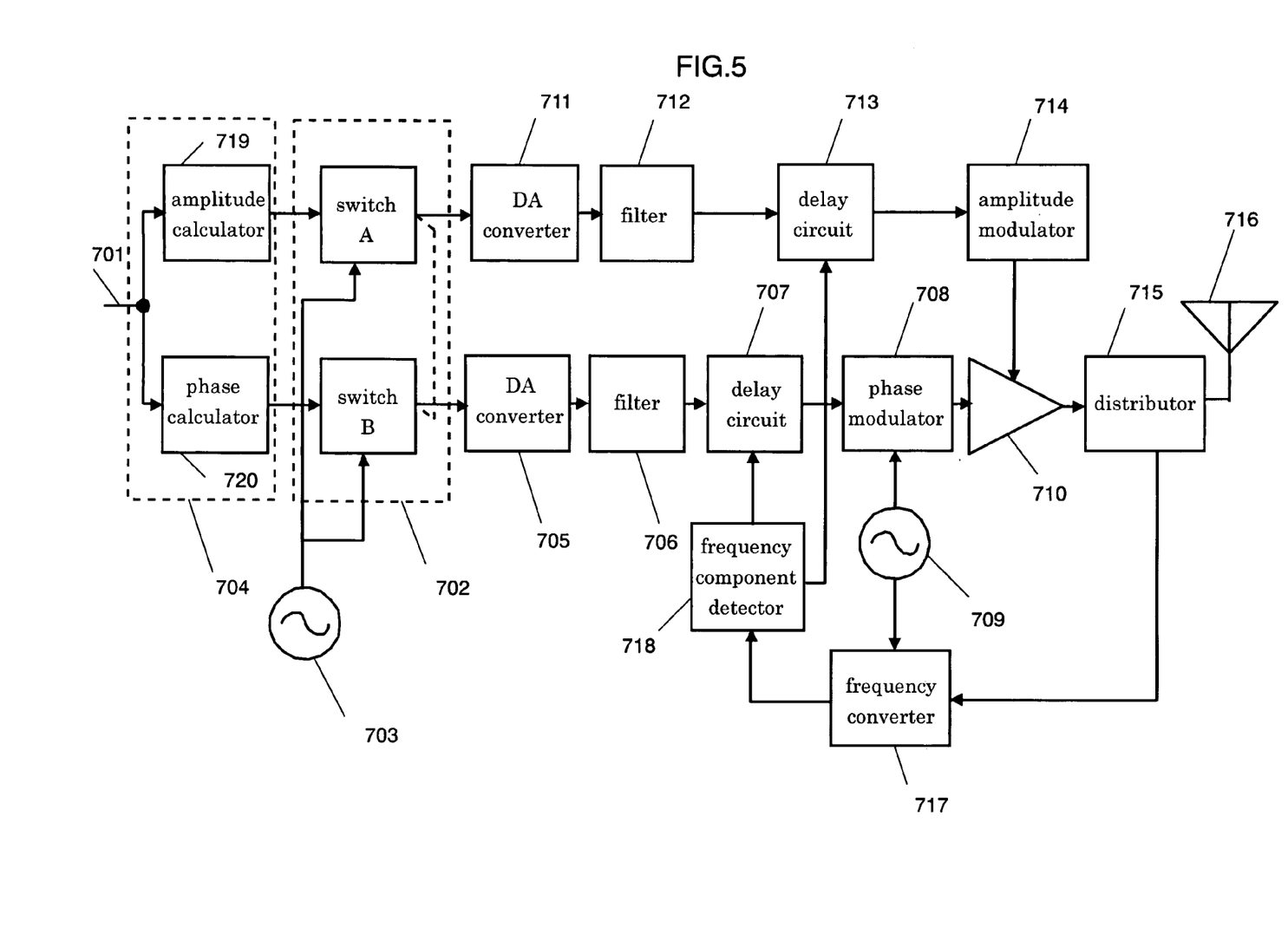
FIG. 5 shows a block diagram illustrating a transmitter apparatus in accordance with a fifth exemplary embodiment of the present invention.

FIG. 5 shows a block diagram illustrating a transmitter apparatus in accordance with the fifth exemplary embodiment of the present invention. Computation circuit 704 is formed of amplitude calculator 719 and phase calculator 720. Amplitude calculator 719 calculates an amplitude component of transmission base-band signal 701 supplied thereto. Phase calculator 720 calculates a phase component of signal 701 supplied thereto. Switch 702 is formed of switches 702A and 702B interlocking with each other.

Switch 702A switches an output from amplitude calculator 719 to/from a signal output from chirp signal source 703, of which frequency is variable time-dependently, before outputting. Switch 702B switches an output from phase calculator 720 to/from a signal output from chirp signal source 703 before outputting. DA converter 705 converts an output from switch 702B into an analog signal. Filter 706 passes specific frequencies out of a signal output from DA converter 705.

Delay circuit 707 delays a signal output from filter 706. Carrier signal source 709 outputs a carrier signal having a constant frequency. Phase modulator 708 mixes an output from delay circuit 707 and a signal output from carrier signal source 709, thereby producing a phase modulation signal. Power amplifier 710 amplifies an output from phase modulator 708 up to a desirable power level. DA converter 711 converts a signal output from switch 702A into an analog signal.

Filter 712 passes specific frequencies out of a signal output from DA converter 711. Delay circuit 713 delays a signal output from filter 712. Based on a signal output from delay circuit 713, amplitude modulator 714 outputs a voltage that controls power amplifier 710. Distributor 715 distributes a signal from power amplifier 710 to antenna 716 and frequency converter 717.

Antenna 716 transmits the signal distributed from distributor 715. Frequency converter 717 converts a frequency of the signal distributed from distributor 715 by using the signal output from carrier signal source 709. Frequency component detector 718 controls a delay amount of delay circuits 707 and 713 based on a signal output from frequency converter 717.

An operation of the foregoing transmitter apparatus is demonstrated hereinafter. In this transmitter apparatus, when a delay amount of delay circuits 707 and 713 is adjusted, input signals to DA converters 705 and 711 are switched from an output signal of computation circuit 702 to an output signal of chirp signal source 703 with switch 702. The chirp signal fed into DA converter 705 runs as a first chirp signal from switch 702B through DA converter 705, filter 706 and arrives at delay circuit 707.

Phase modulator 708 mixes the first chirp signal supplied from delay circuit 707 with the carrier signal output from carrier signal source 709. Power amplifier 710 amplifies an output from phase modulator 708 up to a desirable power level.

On the other hand, a chirp signal fed into DA converter 711 runs as a second chirp signal from switch 702A through DA converter 711, filter 712 and arrives at delay circuit 713. Amplitude modifier 714 controls a bias voltage of power amplifier 710 with the second chirp signal supplied from delay circuit 713. As a result, power amplifier 710 outputs a signal formed by mixing the first chirp signal with the second chirp signal.

The signal output from power amplifier 710 is distributed through distributor 715, and parts of the signal are fed into frequency converter 717, which then mixes the signal from distributor 715 with the carrier signal from carrier signal source 709, thereby obtaining a signal having a frequency component which is a difference between the first chirp signal and the second chirp signal.

The first and second chirp signals are mixed in power amplifier 710, and when no delay exists between the route of the amplitude component and the route of the phase component, the signals having the same frequency are mixed. Thus frequency converter 717 outputs a signal having a dc component only. On the other hand, when some delay exists between the foregoing two routes, frequency converter 717 outputs a signal having an ac component.

Frequency component detector 718 detects the ac component, i.e. frequency component, from the output signal of frequency converter 717, and adjusts the delay amount of delay circuits 707 and 713 such that the frequency component has only a dc component, thereby controlling the timing between both the routes. An output from frequency converter 717 includes a frequency component that is a sum of the first and second chirp signals; however, this component is not needed, so that it is suppressed by the low pass filter.

As discussed above, the transmitter apparatus uses chirp signals instead of a transmission base-band signal, thereby detecting a frequency component of a signal down-converted from an output of the power amplifier. A delay amount of the delay circuits is so adjusted as the frequency component has only a dc component, so that the timings of the route of amplitude component and the route of phase component can agree with each other. As a result, the transmitter apparatus, in which the distortions produced in the power amplifier can be reduced and yet high power-efficiency is realized, is obtainable.

Exemplary Embodiment 6

Figure 6:
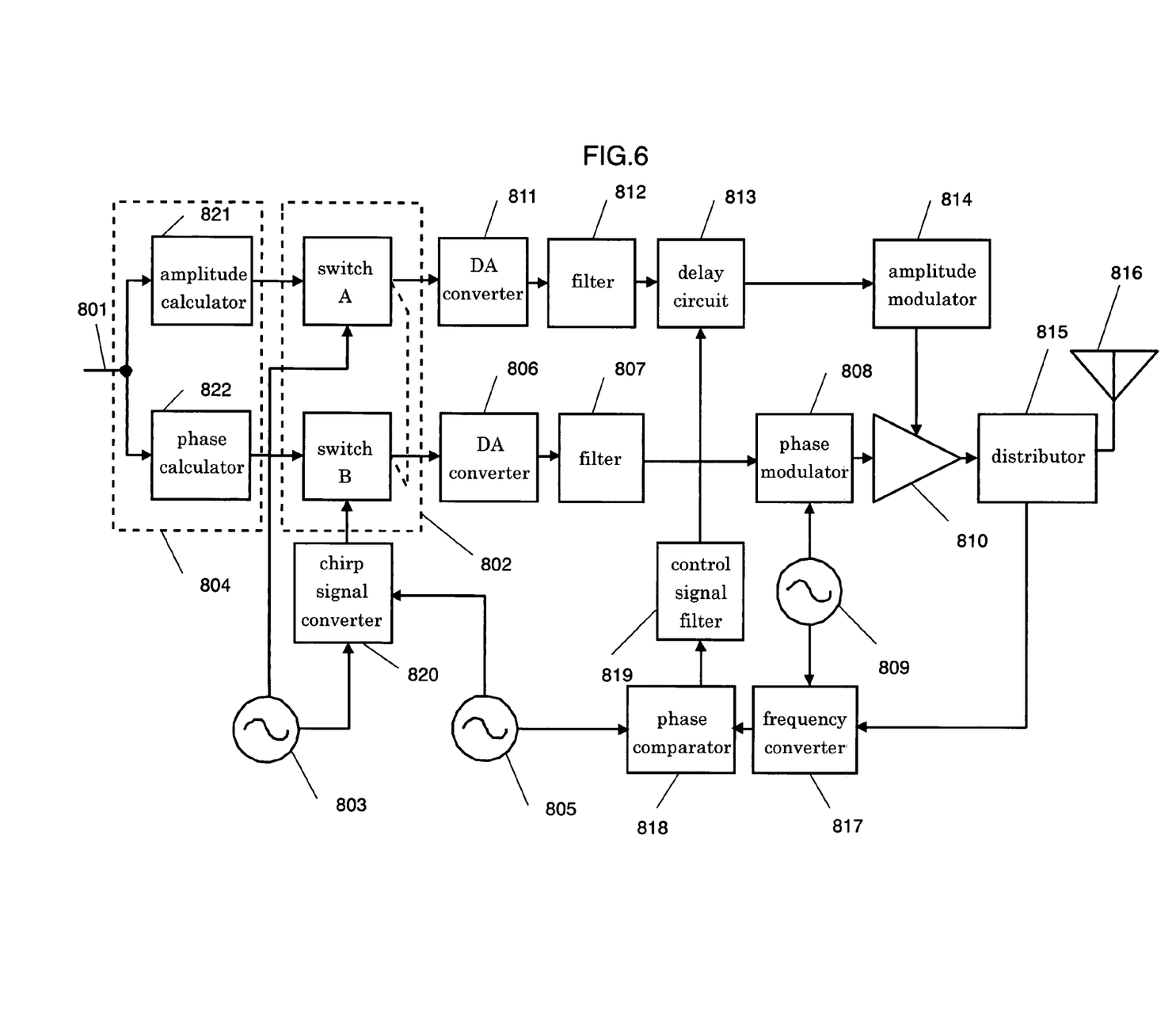
FIG. 6 shows a block diagram illustrating a transmitter apparatus in accordance with a sixth exemplary embodiment of the present invention.

FIG. 6 shows a block diagram illustrating a transmitter apparatus in accordance with the sixth exemplary embodiment. Computation circuit 804 is formed of amplitude calculator 821 and phase calculator 822. Amplitude calculator 821 calculates an amplitude component of transmission base-band signal 801 supplied thereto. Phase calculator 822 calculates a phase component of signal 801 supplied thereto.

Chirp signal converter 820 converts a signal output from chirp signal source 803 with a signal from fixed-frequency signal source 805 free from time-dependent changes in frequency, then outputs the resultant signal. Switch 802 is formed of switches 802A and 802B interlocking with each other.

Switch 802A switches an output from amplitude calculator 821 to/from a signal output from chirp signal source 803 before outputting. Switch 802B switches an output from phase calculator 822 to/from a signal output from chirp signal source 820 before outputting. DA converter 806 converts an output from switch 802B into an analog signal. Filter 807 passes specific frequencies out of a signal output from DA converter 806. Carrier signal source 809 outputs a carrier signal having a constant frequency.

Phase modulator 808 mixes an output from filter 807 and a signal output from carrier signal source 809, thereby producing a phase modulation signal. Power amplifier 810 amplifies an output from phase modulator 808 up to a desirable power level. DA converter 811 converts a signal output from switch 802A into an analog signal. Filter 812 passes specific frequencies out of a signal output from DA converter 811.

Delay circuit 813 delays a signal output from filter 812. Based on a signal output from delay circuit 813, amplitude modulator 814 outputs a voltage that controls power amplifier 810. Distributor 815 distributes a signal from power amplifier 810 to antenna 816 and frequency converter 817. Antenna 816 transmits the signal distributed from distributor 815.

Frequency converter 817 converts a frequency of the signal distributed from distributor 815 by using a signal output from carrier signal source 809. Phase comparator 818 compares a phase of a signal output from frequency converter 817 with a phase of fixed-frequency signal source 805. Control signal filter 819 controls phase-lock between phase comparator 818 and delay circuit 813.

An operation of the foregoing transmitter apparatus is demonstrated hereinafter. This transmitter apparatus operates basically in the same manner as that of the fifth embodiment. This apparatus uses the following two signals: a first chirp signal generated by chirp signal source 803; a second chirp signal output from chirp signal converter 820 which mixes fixed-frequency signal source 805 with the first chirp signal for outputting the second chirp signal.

The first chirp signal is output from DA converter 811 to a signal route of the amplitude component, and the second chirp signal is output from DA converter 806 to a signal route of the phase component. If there is no delay between those two routes, and if those two signals are mixed at the same timing in power amplifier 810, frequency converter 817 outputs a signal having the same frequency as that of fixed-frequency signal source 805.

The signal having the same frequency as that of fixed-frequency signal source 805 is that the frequency of the signal is equal to a difference in frequency between the first and second chirp signals. Therefore, phase comparator 818 compares the phase of a signal output from frequency converter 817 with the phase of a signal output from fixed-frequency signal source 805. Then comparator 818 adjusts a delay amount of delay circuit 813 such that the difference in phase becomes constant, i.e. the frequencies become equal to each other, thereby controlling the timing between both of the routes.

Delay circuit 813 is formed of circuit elements of which values are changed by a voltage of, e.g. varactor diode, so that a delay amount can be controlled by a voltage. At the same time, control signal filter 819 is disposed as a loop filter, so that phase-lock operation between phase comparator 818 and delay circuit 813 can be controlled. Those preparations allow the phase-lock control to adjust the timing of mixing the amplitude component with the phase component in power amplifier 810.

A frequency difference between the first and second chirp signals output from frequency converter 817 happens to agree with the frequency of fixed-frequency signal source 805. However, this phenomenon can be avoided by setting the changes in frequency of the chirp signals appropriately in response to a presumable difference in delay between the signal routes.

The transmitter apparatus having delay circuit 813 in the route of amplitude component is discussed above; however, if a signal runs faster in the route of phase component than in the route of amplitude component, the delay circuit is disposed in the route of phase component.

The transmitter apparatus thus uses two chirp signals, of which frequency difference is constant, instead of a transmission modulation signal. A delay amount of the delay circuit is controlled such that a signal down-converted from an output of the power amplifier by a carrier frequency signal becomes the same as the signal of fixed frequency source 905, i.e. the signal of the frequency difference between the first and the second chirp signals. This control achieves the phase lock. Those preparations allow the amplitude component and the phase component to be mixed automatically at the same timing in the power amplifier, so that the power amplifier can reduce its distortions and obtain high power-efficiency.

INDUSTRIAL APPLICABILITY

The transmitter apparatus of the present invention can detect a distortion component of a signal output from a power amplifying means, and control a timing of a voltage which automatically controls the power amplifying means to minimize the distortion component. This structure allows reducing distortions of a transmission signal as well as improving power efficiency of the power amplifying means.

The invention claimed is:

1. A transmitting method that controls a voltage of a power amplifying means in response to an envelope amplitude of a transmission signal, the method comprising:
   calculating a distortion component of a feedback signal provided from an output of the power amplifying means;
   automatically adjusting a delay amount using the calculated distortion component such that the distortion component is minimized; and
   delaying a voltage that controls the power amplifying means responsive to the adjusted delay amount to automatically control a timing of the voltage, the voltage being based on the envelope amplitude.

2. The transmitting method of claim 1, wherein the distortion component is out-of-band power of the transmission signal.

3. A transmitter apparatus comprising:
   a first delay means for adjusting a timing of a voltage that controls a power amplifying means responsive to a delay amount, the voltage being based on a transmission signal;
   a distributor for distributing an output from the power amplifying means and providing a feedback signal; and
   a distortion adjusting means for calculating a distortion component of the transmission signal by using the feedback signal, the calculated distortion component being used to automatically adjust the delay amount provided to the first delay means such that the distortion component is minimized.

4. The transmitter apparatus of claim 3, wherein the distortion component is out-of-band power of the transmission signal.

5. The transmitter apparatus of claim 4, wherein the transmission signal is a transmission base-band signal and the transmitter apparatus further comprises:
   an amplitude calculating means for calculating an amplitude of the transmission base-band signal;
   a voltage controlling means for controlling a bias voltage supplied to the power amplifying means based on an output from the first delay means;
   a second delay means for delaying the transmission base-band signal;
   a first frequency converting means for converting an output from the second delay means into an RF signal;
   a second frequency converting means for converting the feedback signal into one of a base-band signal and an IF signal; and
   a delay amount calculating means for adjusting the delay amount provided to the first delay means and to the second delay means based on an output from the distortion adjusting means such that the out-of-band power calculated by the distortion adjusting means is minimized,
   wherein the first delay means delays an output from the amplitude calculating means, the voltage controlling means controls the bias voltage based on the output from the first delay means, the power amplifying means amplifies an output from the first frequency converting means, and the distortion adjusting means calculates the out-of-band power based on an output from the second frequency converting means.

6. The transmitter apparatus of claim 5, wherein the out-of-band power is leakage power to an adjacent channel.

7. The transmitter apparatus of claim 6, wherein an abnormal output from the distortion adjusting means halts an operation of the transmitter apparatus.

8. The transmitter apparatus of claim 5, wherein an abnormal output from the distortion adjusting means halts an operation of the transmitter apparatus.

9. The transmitter apparatus of claim 5 further comprising:
   a phase calculating means for calculating a phase of the transmission base-band signal; and
   a voltage control oscillating means for outputting a phase modulation signal based on the output from the second delay means,
   wherein the second delay means delays an output from the phase calculating means, and the first frequency converting means converts an output from the voltage control oscillating means into the RF signal.

10. The transmitter apparatus of claim 9, wherein the out-of-band power is leakage power to an adjacent channel.

11. The transmitter apparatus of claim 10, wherein an abnormal output from the distortion adjusting means halts an operation of the transmitter apparatus.

12. The transmitter apparatus of claim 9, wherein an abnormal output from the distortion adjusting means halts an operation of the transmitter apparatus.

13. The transmitter apparatus of claim 3, wherein the transmission signal is a transmission base-band signal and the transmitter apparatus further comprises:
   a voltage control oscillating means for producing a carrier signal having a constant envelope and being phase-modulated by a phase component of the transmission base-band signal; and
   a second delay means for delaying a signal of the phase component fed into the voltage control oscillating means,
   wherein the distortion adjusting means adjusts the delay amount provided to the first delay means and provided to the second delay means.

14. The transmitter apparatus of claim 13, wherein the second delay means is a first filter that limits the signal of the phase component to a band, the first delay means is a second filter that limits a signal of the amplitude component to the band, and the distortion adjusting means changes passing characteristics of one of the first filter and the second filter for controlling the delay amount.

* * * * *